United States Patent [19]
Regan

[11] Patent Number: 4,762,028
[45] Date of Patent: Aug. 9, 1988

[54] ROTARY DRILL BITS

[75] Inventor: Michael C. Regan, Robinswood, United Kingdom

[73] Assignee: NL Petroleum Products Limited, Gloucestershire, England

[21] Appl. No.: 46,904

[22] Filed: May 5, 1987

[30] Foreign Application Priority Data

May 10, 1986 [GB] United Kingdom ............... 8611448

[51] Int. Cl.$^4$ .............................................. B21K 5/02
[52] U.S. Cl. .................................... 76/108 A; 29/447
[58] Field of Search ............ 76/108 R, 108 A, 101 R, 76/101 E, DIG. 11, DIG. 12, DIG. 2; 29/447, 800

[56] References Cited

U.S. PATENT DOCUMENTS 3,513,728  5/1970  Hudson et al. .................... 76/108 R
4,396,077  8/1983  Radtke ............................. 76/108 A Primary Examiner—Roscoe V. Parker
Attorney, Agent, or Firm—Browning, Bushman, Zamecki & Anderson

[57] ABSTRACT

A method of manufacturing a rotary drill bit of the kind comprising a bit body having a shank for connection to a drill string, a plurality of cutting structures mounted in sockets in the bit body, and a number of nozzles also mounted in sockets in the bit body and communicating with a passage for supplying drilling fluid to the face of the bit. The method includes the steps of forming at least part of the bit body from steel, forming the sockets in the bit body part, plugging each socket with a former which projects partly beyond the bit face, applying to the bit face a coating of a fusible hardfacing material, heating the coated bit body part so as to fuse the hardfacing material, cooling the bit body part to solidify the fused hardfacing material, and then removing the formers from the sockets. Each former is formed of material, such as austenitic stainless steel, having a higher coefficient of thermal expansion than the steel of the bit body part, and is so dimensioned that it can be readily inserted into its socket at ambient temperature but expands relatively to the socket at the fusing temperature so as tightly to engage the interior surface of the socket.

13 Claims, 2 Drawing Sheets

ROTARY DRILL BITS

BACKGROUND OF THE INVENTION

The invention relates to rotary drill bits for use in drilling or coring deep holes in subsurface formations.

The invention is applicable to rotary drill bits of the kind comprising a bit body having a shank for connection to a drill string, a bit face on the bit body, a plurality of cutting structures mounted in sockets in the bit body and projecting from the face of the bit, and a number of nozzles also mounted in sockets in the bit body and communicating with a passage for supplying drilling fluid to the face of the bit, at least part of the bit body being formed from steel.

Each cutting structure may comprise a cutting element mounted on a carrier, such as a stud or post, which is received in a socket in the bit body. One common form of cutting element comprises a circular tablet having a hard facing layer of polycrystalline diamond or other superhard material and a backing layer of less hard material such as cemented tungsten carbide. The two-layer arrangement of the cutting element provides a degree of self-sharpening since, in use, the less hard backing layer wears away more easily than the harder cutting layer.

In such steel-bodied drill bits the bit face is susceptible to wear and erosion during use, particularly in the vicinity of the nozzles from which drilling fluid emerges at high velocity and with substantial turbulence. Accordingly, attempts have been made to apply a hardfacing to the bit face, around the cutting structure. U.S. Pat. No. 4,396,077 describes, for example, a method of applying a tungsten carbide hardfacing to a steel bodied drill bit after the cutting structures have been assembled in the sockets.

However, as discussed in U.S. Pat. No. 4,396,077, the application of a hardfacing to the bit body after the cutting structures have been assembled into it carries with it the risk of thermal damage to the cutting elements during the hardfacing process. Accordingly, it is desirable to provide the hardfacing before the cutting structures are assembled with the bit body. However, this in turn gives rise to other problems, particularly with regard to preventing the hardfacing material entering the sockets. In order to prevent coating material from entering the sockets, it has been the practice to plug the sockets temporarily with plugs of graphite or mild steel. However, there is then a conflict between the requirement that the formers should tightly fill the sockets to prevent any possibility of ingress of coating material and the requirement that the formers have to be removed from the sockets after the hardfacing process. Using the former materials employed hitherto, if the formers are sized to fit sufficiently tightly within the sockets to prevent any possibility of ingress of the hardfacing material, then the formers must be removed destructively, for example by drilling them out. Not only is this a time-consuming process, but it may also mean that the internal surfaces of the sockets become damaged during removal of the formers with the result that they have to be reamed to the correct size. On the other hand, if the formers are sized so that they may be more readily removed from the sockets after hardfacing, there is an increased risk of ingress of coating material into the sockets so that, again, the sockets may have to be accurately reamed to size. The present invention provides an improved method of manufacturing a rotary drill bit where the above problems may be reduced or overcome.

SUMMARY OF THE INVENTION

According to the invention there is a provided a method of manufacturing a rotary drill bit of the kind comprising a bit body having a shank for connection to a drill string, a bit face on the bit body, a plurality of cutting structures mounted in sockets in the bit body and projecting from the bit face, and a number of nozzles also mounted in sockets in the bit body and communicating with a passage for supplying drilling fluid to the face of the bit, the method including the steps of forming at least part of the bit body from steel, forming said sockets in the bit body part, plugging each socket with a former which projects partly beyond the bit face, applying to the bit face a coating of a fusible hardfacing material, heating the coated bit body part so as to fuse said hardfacing material, cooling the bit body part to solidify the fused hardfacing material, and removing said formers from the sockets, each said former being formed of material having a higher coefficient of thermal expansion than the steel of the bit body part, and being so dimensioned in relation to the socket into which it is to be inserted that it can be readily inserted into said socket at ambient temperature but expands relatively to the socket at the fusing temperature so as tightly to engage the interior surface of the socket.

It will be appreciated that this means that the formers may be readily and non-destructively removed from the sockets after the hardfacing process has been completed.

The former may be made of austenitic stainless steel.

In addition to the above feature, and in order further to facilitate removal of the formers from the sockets, each said former may have a surface coating of a material which does not react significantly with the steel of the bit body or with the hardfacing material, whereby the former may be removed substantially in one piece from its socket after cooling of the bit body. The surface coating may be a ceramic, such as titanium nitride. The surface coating is such as to inhibit reaction between the hardfacing material and/or the steel and the material of the main body of the former.

Titanium nitride is particularly suitable as a surface coating where the formers are made of austenitic stainless steel, and may be applied to the formers using a chemical or physical vapour deposition process. Such process may also be suitable for the application of surface coatings of other ceramics.

Preferably each former is provided with means for attachment of a tool whereby the former may be gripped to facilitate its removal from the finished bit body. For example the former may be provided with an internally threaded bore into which a threaded portion of an extraction tool may be inserted or may be provided with an extension which projects from the finished bit body and which may be gripped by a suitable tool.

In the above methods the hardfacing coating material may comprise a nickel-based or cobalt-based alloy containing, for example, chromium, iron, boron and silicon and particles of tungsten carbide.

The coating bit body may be heated in a furnace such as a vacuum or hydrogen furnace to effect fusing of the coating material.

The invention includes within its scope a rotary drill bit of the kind first referred to when formed by any of the above mentioned methods.

DETAILED DESCRIPTION OF THE PREFERRED EMBODIMENTS

Figure 1:
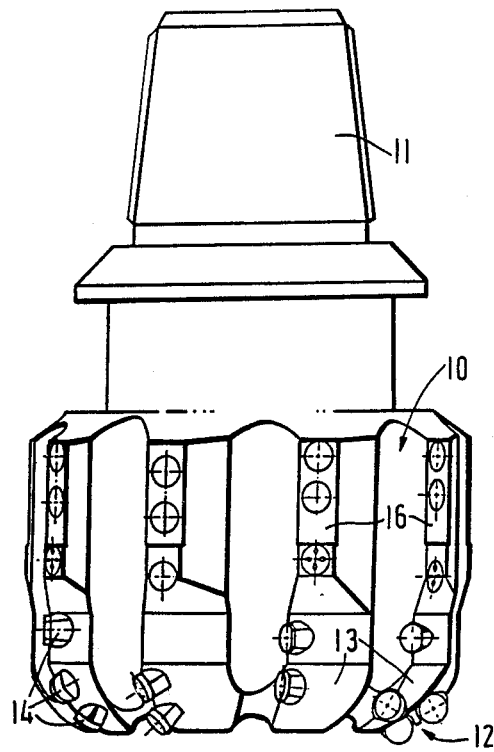
FIG. 1 is a side elevation of a typical drill bit of a kind which may be manufactured by the method according to the invention.
Figure 2:
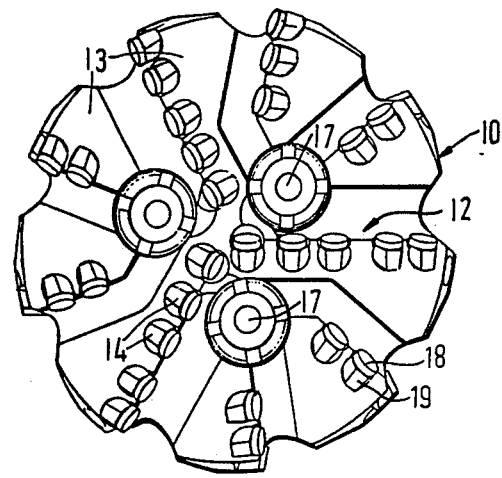
FIG. 2 is an end elevation of the drill bit shown in FIG. 1.

Referring to FIGS. 1 and 2, the bit body 10 is machined from steel, and has a threaded shank 11 at one end for connection to the drill string.

The operative end face 12 of the bit body is formed with a number of blades 13 radiating from the central area of the bit, and the blades carry cutting structures 14 spaced apart along the length thereof.

The bit has a gauge section including kickers 16 which contact the walls of the bore hole to stabilise the bit in the bore hole. In known manner abrading elements are mounted in the kickers 16. A central passage (not shown) in the bit body and shank delivers drilling fluid through nozzles 17 in the end face 12 in known manner.

Each cutting structure 14 comprises a preform cutting element 18 mounted on a carrier 19 in the form of a stud which is secured within a socket machined into the bit body. Conventionally, each preform cutting element 18 is usually in the form of a circular tablet comprising a thin facing layer of polycrystalline diamond bonded to a backing layer of tungsten carbide, both layers being of uniform thickness. The rear surface of the backing layer of each cutting element is bonded to a suitably orientated surface on the stud, which may also be formed from tungsten carbide.

It will be appreciated that this is only one example of the many possible variations of the type of bit to which the invention is applicable.

As previously described, the invention provides a method of applying a hardfacing to at least the end face 12 of the bit body. Because the fusion temperature involved in the hardfacing process could lead to deterioration in the mechanical properties of the threaded shank 11, it may be desirable for the bit body to comprise a separately formed steel crown which is machined, hardfaced and then subsequently attached to the threaded shank.

The crown of the bit body is normally produced by computer-controlled turning and milling operations. In order to allow for the thickness of the hardfacing coating which is to be applied over the bit face, a suitable thickness of steel, for example 2 mm, is removed from the profile of the standard bit by re-programming the turning and milling operations. A 4 mm allowance on the diameter of the sockets for receiving the nozzles 17 is also provided for since, as will be described, the nozzle sockets are also desirably coated with hardfacing to reduce erosion at the outlet of the nozzles, which area is normally very susceptible to erosion in steel bodied bits.

After machining of the crown to form the required profile and sockets, the sharp corners on the profile are fettled, hardened steel plugs are fitted to the sockets to protect the internal surfaces thereof, and the external surface of the crown is then grit blasted to provide a perfectly clean surface to receive the hardfacing.

These first stage plugs are then removed and then, in accordance with the invention, there are inserted in the sockets formers which have a higher coefficient of thermal expansion than the steel of the crown and/or are coated with a surface coating of material which does not significantly react with the steel of the crown or the hardfacing material. For example the formers may be formed of austenitic stainless steel having a surface coating of a ceramic such as titanium nitride. The formers are so dimensioned in relation to the sockets into which they are to be inserted that they can be readily inserted into the sockets at ambient temperature.

Figure 3:
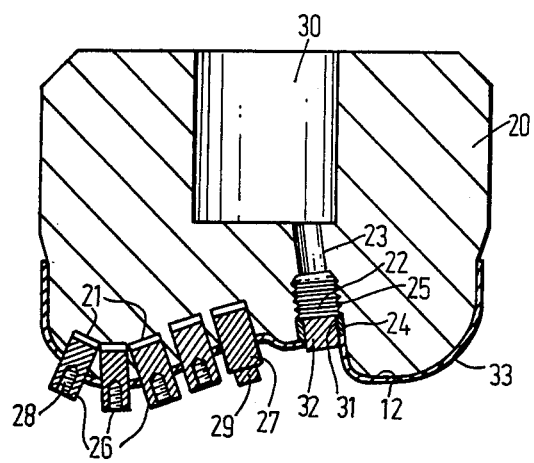
FIG. 3 is a diagrammatic section through part of a drill bit illustrating steps in the manufacturing process.

FIG. 3 shows diagrammatically the crown portion 20 of the bit body formed with circular cross section cylindrical sockets 21 which, in the finished bit, will receive the similarly sectioned studs of the cutting structures. Also machined into the crown are a number of sockets 22 to receive the nozzles 17, which sockets communicate with passages 23 leading to the central passage 30 for supplying drilling fluid to the face of the bit. Each nozzle socket 22 has an outer cylindrical portion 24 and an inner smaller diameter threaded portion 25.

FIG. 3 shows diagrammatically formers 26 and 27 inserted in the sockets 21 which are to receive the cutting structures. The formers 26 are each provided with an internally threaded blind bore 28 into which a threaded tool may be inserted to facilitate withdrawal of the forms from the crown after the hardfacing process has been completed. An alternative shape of former is shown at 27 which includes a projection 29, for example of square section, which may be gripped by a suitable extraction tool. It will be seen that each of the formers 26, 27 projects beyond the surface 12 of the crown.

Within the outer cylindrical portion 24 of each nozzle socket 22 there is fitted a pre-machined close fitting ring 31 of stellite to provide a final close tolerance hole to allow the nozzle 17 to be fitted accurately. The stellite ring 31 also prevents coating material running on to the threaded portion 25 of the nozzle socket. A graphite plug 32 is inserted tightly into the stellite ring 31.

After all the formers 26, 27 and the stellite rings 31 and graphite plugs 32 have been fitted, the surface 12 of the crown is sprayed with the hardfacing coating material which, as previously described, may comprise a nickel based alloy with particles of tungsten carbide, the nickel based alloy containing, for example, chromium, iron, boron and silicon. It will be appreciated however, that other suitable sprayable coating materials may be employed. The nature of the hardfacing coating materials and the spraying process will be well understood by those skilled in the art and will not therefore be described in detail.

Spraying of the hardfacing coating is carried out to a thickness that allows for subsequent volume shrinkage of the coating on fusing. For example a final thickness of 1.5 to 3 mm may be desirable. The gauge section of the crown is masked off to the extent required to limit the extent of the hardfacing. In FIG. 3 the sprayed on hardfacing material is indicated at 33.

After the crown has been sprayed with the hardfacing material it is placed in a furnace and raised to a temperature where the sprayed coating fuses. The fusing may be effected in a vacuum or hydrogen furnace. The fusing temperature is critically controlled to prevent slumping of the coating, i.e. liquefaction of the coating to an extent where it may begin to flow over the surface of the crown. Visual observation is made during this stage and, in known manner, experience is used to judge the time/temperature requirements to produce a dense uniform fused coating.

One fusion cycle is preferred, but two may be necessary if it is judged that complete fusion has not been attained on the first cycle.

After the coating has been fused the crown is allowed to cool and when cold the formers 26 and 27 are removed from the sockets. Since the formers may be formed of material of greater coefficient of thermal expansion than the steel of the crown 20, they will have expanded during the fusing process so as tightly to fill the sockets and prevent the ingress of the coating material. Upon cooling the formers will contract more than the material of the crown so that they may be readily withdrawn from the sockets by use of a suitable tool inserted in the threaded bores 28 or applied to the projections 29. The surface coating of the formers, when provided may also facilitate removal of the formers from the sockets.

The graphite plugs 32 are removed from the nozzel sockets 22 and the stellite rings 31 will be held in the sockets by the hardfacing material, as shown in FIG. 3, to provide accurate close tolerance holes for the fitting of the nozzles 17.

Before the cutting structures and nozzles are applied to the crown, the crown is welded to the shank of the drill bit to ease subsequent handling on assembly.

In some forms of drill bit of the kind to which the invention relates, some of the cutting structures to be mounted on the bit body may be thermally stable at the temperatures to which the bit body is subjected during the hardfacing process. For example, some cutters may comprise studs of tungsten carbide impregnated with natural diamonds, such as are often used in the gauge region of the drill bit. Thermally stable polycrystalline diamond is also available and may be used in cutting structures.

In a bit which includes such thermally stable cutting structures, therefore, it may be more convenient for these particular cutting structures to be mounted in their sockets before the hardfacing process is carried out, since they will not be susceptible to thermal damage during the process. In such cases it will not of course be necessary to protect those sockets with formers in accordance with the invention. It should therefore be understood that the invention is not limited to arrangements where all the sockets in a bit body are protected, but covers also arrangements where only some of the sockets are protected.

I claim:

1. A method of manufacturing a rotary drill bit of the kind comprising a bit body having a shank for connection to a drill string, a bit face on the bit body, a plurality of cutting structures mounted in sockets in the bit body and projecting from the bit face, and a number of nozzles also mounted in sockets in the bit body and communicating with a passage for supplying drilling fluid to the face of the bit, the method including the steps of forming at least part of the bit body from steel, forming said sockets in the bit body part, plugging each socket with a former which projects partly beyond the bit face, applying to the bit face a coating of a fusible hardfacing material, heating the coated bit body part so as to fuse said hardfacing material, cooling the bit body part to solidify the fused hardfacing material, and removing said formers from the sockets, each said former being formed of material having a higher coefficient of thermal expansion than the steel of the bit body part, and being so dimensioned in relation to the socket into which it is to be inserted that it can be readily inserted into said socket at ambient temperature but expands relatively to the socket at the fusing temperature so as tightly to engage the interior surface of the socket.

2. A method according to claim 1, wherein the former is made of austenitic steel.

3. A method according to claim 1, wherein each said formed is provided with a surface coating of a material which does not react significantly with the steel of the bit body or with the hardfacing material, whereby the former may be removed substantially in one piece from its socket after cooling of the bit body.

4. The method according to claim 3, wherein the surface coating is a ceramic.

5. A method according to claim 4, wherein the coating is applied by a vapour deposition process.

6. A method according to claim 3, wherein the surface coating is titanium nitride.

7. A method according to claim 6, wherein the coating is applied by a vapour deposition process.

8. A method according to claim 1, wherein each former is provided with means for attachment of a tool whereby the former may be gripped to facilitate its removal from the finished bit body.

9. A method according to claim 8, wherein each fomer is provided with an internally threaded bore into which a threaded portion of an extraction tool may be inserted.

10. A method according to claim 8, wherein each former is provided with an extension which projects from the finished bit body and which may be gripped by a suitable tool.

11. A method according to claim 1, wherein the hardfacing coating material comprises a nickel-based alloy containing components selected from chromium, iron, boron and silicon and particles of tungsten carbide.

12. A method according to claim 1, wherein the coated bit body is heated in a furnace to effect fusing of the coating material.

13. A method according to claim 12, wherein the furnace is a vacuum or hydrogen furnace.

* * * * *